United States Patent [19]

Onishi et al.

[11] Patent Number: 5,183,782

[45] Date of Patent: Feb. 2, 1993

[54] PROCESS FOR FABRICATING A SEMICONDUCTOR DEVICE INCLUDING A TUNGSTEN SILICIDE ADHESIVE LAYER

[75] Inventors: Shigeo Onishi; Tsutomu Yamadai, both of Nara; Kazuya Ishihara, Tenri, all of Japan

[73] Assignee: Sharp Kabushiki Kaisha, Osaka, Japan

[21] Appl. No.: 794,146

[22] Filed: Nov. 21, 1991

[30] Foreign Application Priority Data

Jan. 26, 1991 [JP] Japan ............... 3-25601

[51] Int. Cl.$^5$ ............... H01L 21/283; H01L 21/324
[52] U.S. Cl. ............... 437/192; 437/173; 437/200; 437/246; 148/DIG. 147
[58] Field of Search ............... 437/192, 200, 173, 174, 437/190, 246; 357/67 S, 71 S; 148/DIG. 147

[56] References Cited

U.S. PATENT DOCUMENTS

| | | | |
|---|---|---|---|
| 4,629,635 | 12/1986 | Brors | 437/192 |
| 4,672,740 | 6/1987 | Shirai et al. | 148/DIG. 19 |
| 4,789,885 | 12/1988 | Brighton et al. | 357/34 |
| 4,960,732 | 10/1990 | Dixit et al. | 437/192 |
| 5,084,417 | 1/1992 | Joshi et al. | 437/192 |
| 5,117,276 | 5/1992 | Thomas et al. | 437/192 |

FOREIGN PATENT DOCUMENTS 1-15917 1/1989 Japan.
2-7525 1/1990 Japan.

OTHER PUBLICATIONS

"Reliable Tungsten Chemical Vapor Deposition Process . . ." IBM Tech. Disc. Bull., vol. 30, No. 10, Mar. 1988, pp. 162-163.
Wilson, et al., "Rapid Annealing Technology . . . ", Solid State Technology, Jun. 1985, pp. 185-190.

Primary Examiner—T. N. Quach
Attorney, Agent, or Firm—Nixon & Vanderhye

[57] ABSTRACT

A process for fabricating a semiconductor device including the steps of: depositing a tungsten silicide adhesive layer over a wafer having a $SiO_2$ insulating layer with a contact hole defined therein; treating the wafer by a rapid thermal annealing technique to impart further adherence to the tungsten silicide adhesive layer, and depositing tungsten over the tungsten silicide adhesive layer by CVD process to form a tungsten plug layer for electrical contact and a tungsten wiring layer.

9 Claims, 2 Drawing Sheets

PROCESS FOR FABRICATING A SEMICONDUCTOR DEVICE INCLUDING A TUNGSTEN SILICIDE ADHESIVE LAYER

BACKGROUND OF THE INVENTION

1. Field of the Invention

This invention relates to a process for fabricating a semiconductor device and, more particularly to a process for forming a contact and a wiring layer.

2. Related Arts

The so-called blanket CVD-W (tungsten) technique has recently been considered to be promising for plugging up a microscopic contact hole having a diameter of 0.5 μm or less which is formed in a $SiO_2$ insulating layer on a silicon substrate.

Attention has also been attracted to the use of tungsten for a wiring layer in light of its reliability.

Usually an adhesive layer such as of TiN, TiW and $WSi_2$ is formed by sputtering in order to enhance the adherence of a tungsten layer to a $SiO_2$ layer and to prevent chemical reaction of the tungsten layer with a Si substrate when tungsten is deposited.

In the above conventional method, however, when the above adhesive layer is directly formed within a contact hole of a high aspect ratio, a problem of Si attack occurs due to poor step coverage of the adhesive layer. Accordingly, it has been proposed to use a CVD-tungsten silicide film having good step coverage properties for the adhesive layer. Nevertheless, the adherence of such a film to the $SiO_2$ insulating layer and to the Si wafer constituting the bottom of a contact hole is not so good, causing a problem of film peeling when the tungsten layer exerting significant stress is deposited.

SUMMARY OF THE INVENTION

The present invention is accomplished to solve the foregoing problems, and an object thereof is to provide a process for fabricating a highly reliable semiconductor device, by which formed is a tungsten silicide adhesive layer having good step coverage properties even in a contact hole of high aspect ratio so as to prevent the problem of Si attack. The tungsten silicide adhesive layer has also good adherence to the $SiO_2$ insulating layer and to the Si wafer constituting the bottom of the contact hole. Hence, such an adhesive layer is peel-free even under the stress of the plug layer deposited thereon and an overlayer wiring.

Thus, the present invention provides a process for fabricating a semiconductor device comprising the steps of:
  depositing a tungsten silicide adhesive layer over a wafer having a $SiO_2$ insulating layer with a contact hole defined therein;
  treating said wafer by a rapid thermal annealing technique to impart further adherence to said tungsten silicide adhesive layer; and
  depositing tungsten over said tungsten silicide adhesive layer by CVD process to form simultaneously a tungsten plug layer for electrical contact and a tungsten wiring layer.

DETAILED DESCRIPTION OF THE PREFERRED EMBODIMENTS

Figure 1:
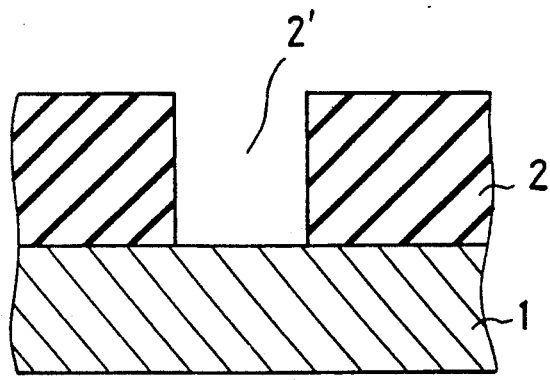
FIGS. 1 through 3 are views illustrating the steps of fabricating a semiconductor device in an example of the invention.

In the present invention the tungsten silicide in the tungsten silicide adhesive layer can be expressed by the chemical formula of $WSi_x$ wherein x is usually 2-3. Accordingly the tungsten silicide adhesive layer will be called hereinbelow a "$WSi_x$ adhesive layer".

In the present invention the $WSi_x$ adhesive layer is deposited over the wafer having a $SiO_2$ insulating layer with a contact hole defined therein.

The above $SiO_2$ insulating layer is provided for electrically insulating a base element such as a transistor formed in the silicon wafer and can be formed by depositing NSG (Non-doped Silicate Glass), BPSG (Boron-doped Phospho-Silicate Glass) or the like on the silicon wafer formed with the base element. The thickness of the $SiO_2$ insulating layer is usually 0.8–2.0 μm.

The above contact hole is provided for electrical contact between the base element and a wiring layer and can be formed by opening a hole into the $SiO_2$ insulating layer at a location above the base element by means of photolithography or a like method.

The above $WSi_x$ adhesive layer is provided for adhering a tungsten plug layer and the tungsten wiring layer to the $SiO_2$ insulating layer and to the Si wafer by intervening therebetween and for preventing a chemical reaction of silicon with tungsten. Such an adhesive layer can be formed by depositing $WSi_x$ usually to 0.05–0.1 μm thick over the $SiO_2$ insulating layer having the contact hole by CVD process or the like.

In the present invention the wafer thus processed is treated by a rapid thermal annealing technique to thereby impart further adherence to the $WSi_x$ adhesive layer.

The above $WSi_x$ adhesive layer is imparted with further adherence by the above treatment. Hence, such an adhesive layer will not be peeled at the interface with the $SiO_2$ insulating layer and with the Si wafer constituting the bottom of the contact hole even if the tungsten plug layer and the tungsten wiring layer are stacked up thereon to exert significant stress. The rapid thermal annealing (RTA) technique allows to reduce the stress of the $WSi_x$ adhesive layer itself at the above-noted interface, thereby rendering the $WSi_x$ adhesive layer peel-free.

The RTA technique can be performed by placing the wafer formed with the $WSi_x$ adhesive layer in a lamp furnace, AP-6000, Hert Pulse or the like and treating it usually at 400°–1000° C. for 5–60 seconds, preferably at 600°–800° C. for 10–30 seconds, and more preferably 700° C. for 10–15 seconds. Further, it is preferred that this technique be performed in situ under vacuum condition for preventing the $WSi_x$ adhesive layer from catching oxygen.

In the present invention, after the above annealing, tungsten is deposited over the $WSi_x$ adhesive layer by CVD process to form the tungsten plug layer for electrical contact and the tungsten wiring layer.

As the above CVD process, it is suitable to use a blanket CVD-tungsten process.

The above tungsten wiring layer is then etched to form a predetermined pattern of wiring in accordance with a conventional method, thus completing a semiconductor device.

EXAMPLE

Examples of the present invention will be described with reference to the drawings but which is merely an example and is not limitative of the invention.

Example 1

As shown in FIG. 1, a BPSG (Boron-doped Phospho-Silicate Glass) layer 2 as the $SiO_2$ insulating layer was deposited over a Si wafer 1 having been formed therein with a base element such as a transistor. Subsequently a contact hole 2' (diameter: 0.5 μm, depth: 1.5 μm) was opened in the BPSG layer at a predetermined location by photolithography.

Figure 2:
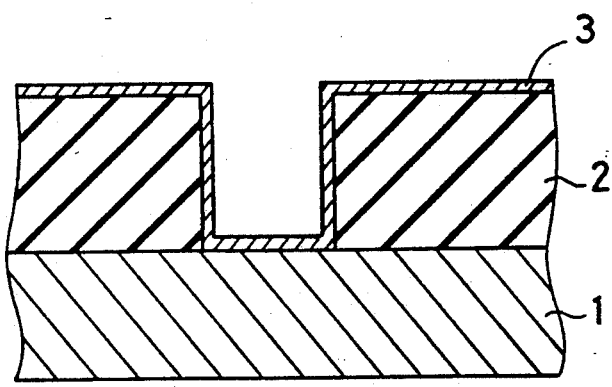

Subsequently, as shown in FIG. 2, a WSix adhesive layer 3 was deposited to 750 μm thick by CVD process. The wafer 1 thus processed was then annealed in situ at 700° C. for 20 seconds in a lamp furnace under vacuum condition for preventing the adhesive layer 3 from catching oxygen.

Figure 3:
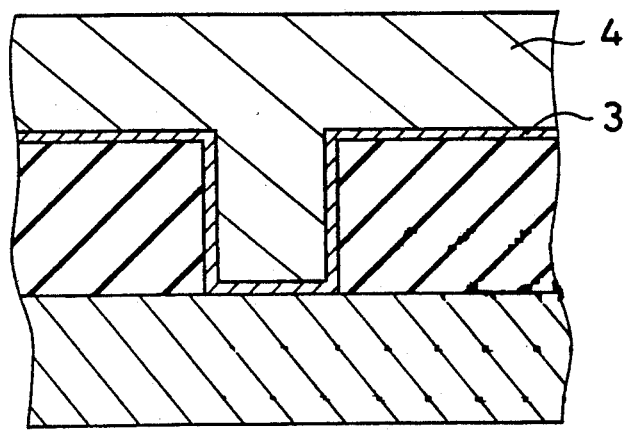

After the annealing, as shown in FIG. 3, a blanket tungsten layer 4 was deposited on the WSix adhesive layer 3 by CVD process, followed by defining a predetermined pattern by a conventional technique to form a tungsten plug layer in the contact hole 2' and a tungsten wiring layer. Thus, a semiconductor device according to the invention was completed. In such a semiconductor device no peeling of the WSix adhesive layer was observed at the interface with the silicon wafer constituting the bottom of the contact hole and with the $SiO_2$ layer.

For comparison, another semiconductor device was fabricated in the same manner as above except that the lamp annealing was not performed after the deposition of the WSix adhesive layer. In such a comparative semiconductor device peeling was observed at the above interface.

Example 2

A $SiO_2$ insulating layer (BPSG or the like) was deposited to about 1.8 μm thick on a silicon substrate having been formed therein with a $N^+$-type impurity diffusion layer. In turn, three contact holes having diameters of about 0.6, 0.9 and 2.0 μm were formed in the $SiO_2$ insulating layer. Contact areas corresponding to respective diameters were 0.28, 0.65 and 3.1 $μm^2$. Forty substrates having such contact holes were prepared. It should be appreciated that forty substrates each having only one contact hole of the same diameter may be prepared for each of the three types of contact holes.

Subsequently a WSix adhesive layer was deposited to 500 Å thick on the bottom of the contact holes. The forty substrates formed with such an adhesive layer were divided into four groups each group consisting of ten substrates. Three groups of the four were respectively annealed at 600° C., 700° C. and 800° C. for 30 seconds under vacuum condition, while the remaining one was not annealed for comparison.

Thereafter, a tungsten plug layer and a tungsten wiring layer were formed on each of the substrates in the same manner as in Example 1 to complete semiconductor devices.

These devices were measured with respect to electric resistance at contact between the $N^+$-type impurity diffusion region and the WSix adhesive layer. The result of the measurement was represented in FIG. 4 in which a contact resistance corresponding to a contact area was plotted at each level of annealing temperature.

Figure 4:
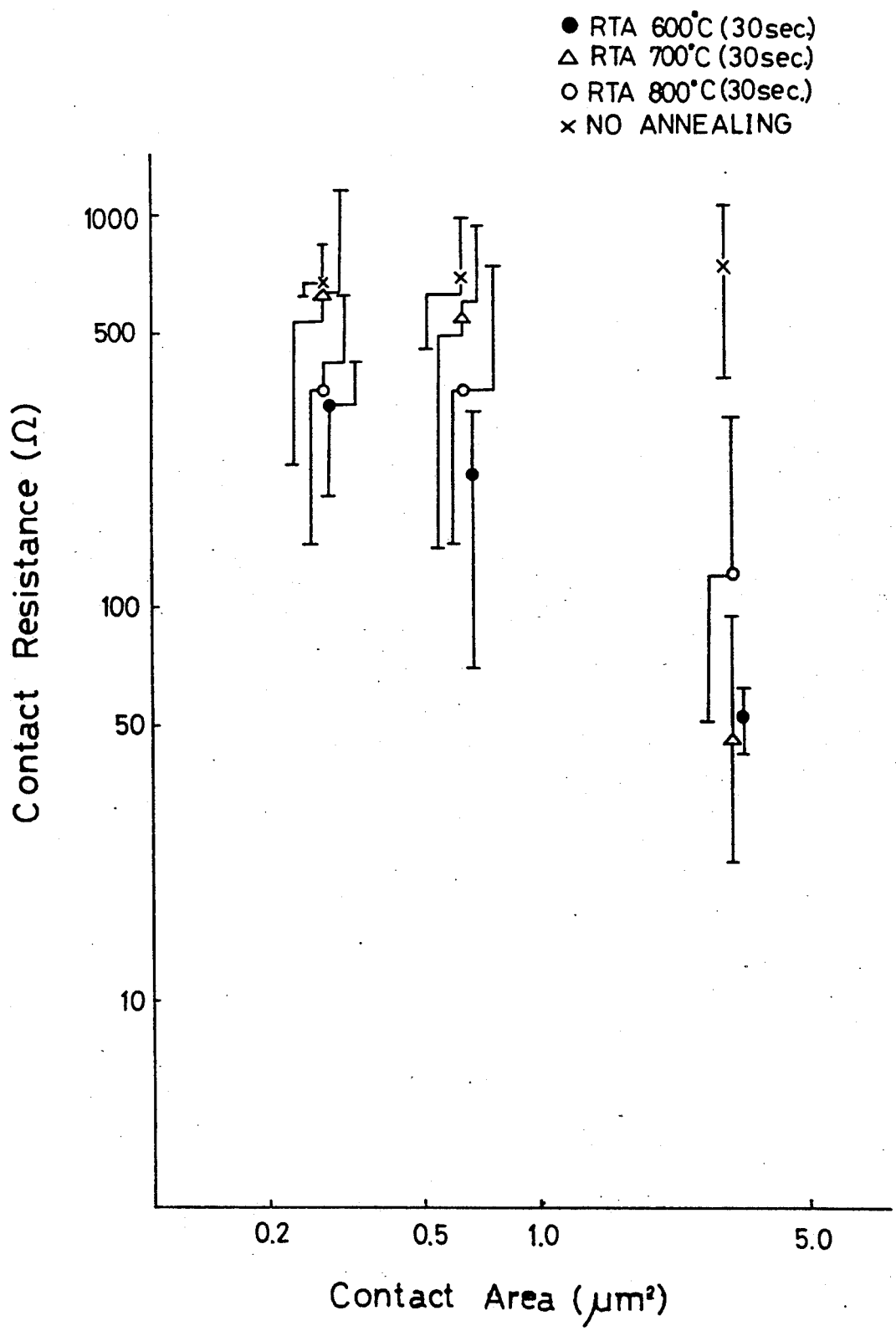
FIG. 4 is a graph representing a relationship between the contact resistance and the contact area in a semiconductor device fabricated in another example of the invention.

FIG. 4 demonstrates that the larger the contact area grew, the lower the contact resistance became when the annealing was performed at 600°-700° C., and thus a good contact was formed. In the case of annealing at 800° C., however, the contact resistance did not substantially lower with increase in contact area. This is presumed that the adherence became poor due to stress caused by too high temperature. Thus, it is especially preferred to perform annealing at 600°-700° C.

As has been described, the present invention can provide a process for fabricating a highly reliable semiconductor device, by which formed is a WSix adhesive layer having good step coverage properties even in a contact hole of high aspect ratio so as to prevent the problem of Si attack. The WSix adhesive layer has also a good adherence to the $SiO_2$ insulating layer and to the Si wafer constituting the bottom of the contact hole. Hence, such an adhesive layer is peel-free even under the stress of the tungsten plug layer deposited thereon and a tungsten wiring layer.

What is claimed is:

1. A process for fabricating a semiconductor device comprising the steps of:
   depositing a tungsten silicide adhesive layer over a wafer having a $SiO_2$ insulating layer with a contact hole defined therein; then
   treating said wafer by a rapid thermal annealing technique to impart further adherence to said tungsten silicide adhesive layer; and then
   depositing tungsten over said tungsten silicide adhesive layer by CVD process to form a tungsten plug layer for electrical contact and a tungsten wiring layer.

2. A process as set forth in claim 1, wherein said tungsten silicide adhesive layer is formed by CVD process.

3. A process as set forth in claim 1, wherein said tungsten silicide adhesive layer has a thickness of 0.05-0.1 μm.

4. A process as set forth in claim 1, wherein said rapid thermal annealing technique is performed by means of a lamp furnace.

5. A process as set forth in claim 1, wherein said rapid thermal annealing technique is performed at a temperature of 400°-1000° C.

6. A process as set forth in claim 1, wherein said rapid thermal annealing technique is performed for 5-60 seconds.

7. A process as set forth in claim 1, wherein said rapid thermal annealing technique is performed in situ using an apparatus for forming said tungsten silicide adhesive layer.

8. A process as set forth in claim 1, wherein tungsten is deposited by a blanket CVD-tungsten process.

9. A process as set forth in claim 1, wherein the step of treating the wafer by a rapid thermal annealing technique is performed at a temperature in a range from about 600° C. to about 700° C.

* * * * *